United States Patent
Hendrix et al.

(10) Patent No.: US 10,830,541 B2
(45) Date of Patent: Nov. 10, 2020

(54) OUTDOOR ELECTRONICS ENCLOSURE WITH DUAL HEAT EXCHANGERS

(71) Applicant: CommScope Technologies LLC, Hickory, NC (US)

(72) Inventors: Walter Mark Hendrix, Richardson, TX (US); Komen Shliker, Plano, TX (US); Stephen P. Watson, Richardson, TX (US)

(73) Assignee: CommScope Technologies LLC, Hickory, NC (US)

( * ) Notice: Subject to any disclaimer, the term of this patent is extended or adjusted under 35 U.S.C. 154(b) by 182 days.

(21) Appl. No.: 16/046,104

(22) Filed: Jul. 26, 2018

(65) Prior Publication Data

US 2019/0063850 A1 Feb. 28, 2019

Related U.S. Application Data

(60) Provisional application No. 62/550,886, filed on Aug. 28, 2017.

(51) Int. Cl.
| | |
|---|---|
| *F28F 9/00* | (2006.01) |
| *H05K 5/02* | (2006.01) |
| *H05K 7/20* | (2006.01) |
| *H05K 5/04* | (2006.01) |

(52) U.S. Cl.
CPC ............ *F28F 9/001* (2013.01); *H05K 5/0226* (2013.01); *H05K 5/04* (2013.01); *H05K 7/202* (2013.01); *H05K 7/206* (2013.01); *H05K 7/20209* (2013.01); *H05K 7/20436* (2013.01); *F28F 2009/004* (2013.01)

(58) Field of Classification Search
CPC .......... H05K 7/20; H05K 5/0226; H05K 5/04; H05K 7/202; H05K 7/20209; H05K 7/20436; H05K 7/206; F28F 2009/004; F28F 9/001
See application file for complete search history.

(56) References Cited

U.S. PATENT DOCUMENTS

| | | | | |
|---|---|---|---|---|
| 5,930,111 | A * | 7/1999 | Yamazaki ............ | G02B 6/4422 165/80.3 |
| 6,164,369 | A * | 12/2000 | Stoller ............... | H05K 7/20572 165/104.33 |
| 2010/0059270 | A1* | 3/2010 | Yeh ..................... | H05K 7/20136 174/547 |
| 2016/0150683 | A1* | 5/2016 | Sagerian .................. | H04N 5/64 361/714 |
| 2017/0077467 | A1* | 3/2017 | Kronke ................. | H01M 10/63 |

* cited by examiner

*Primary Examiner* — Elizabeth J Martin
(74) *Attorney, Agent, or Firm* — Myers Bigel, P.A.

(57) ABSTRACT

An electronics cabinet includes: an enclosure having a floor, a ceiling, a rear wall, opposed side walls, and a front wall that define an interior cavity; a divider panel that divides the interior cavity into upper and lower chambers; a first cooling system mounted to the enclosure to cool the upper chamber; and a second cooling system mounted to the enclosure to cool the lower chamber.

13 Claims, 4 Drawing Sheets

OUTDOOR ELECTRONICS ENCLOSURE WITH DUAL HEAT EXCHANGERS

RELATED APPLICATION

The present application claims the benefit of and priority from U.S. Provisional Patent Application No. 62/550,886, filed Aug. 28, 2017, the disclosure of which is hereby incorporated herein in its entirety.

FIELD OF THE INVENTION

The present invention relates generally to cabinets, and more specifically to electronics cabinets.

BACKGROUND

Outdoor electronic cabinets have become popular in recent years. They can protect a wide range of electronic equipment including radios, multicarrier power amplifiers (MCPA), power supplies, batteries, and wireless cell site backhaul equipment. These cabinets can protect base station equipment from environmental conditions while minimizing operating expenses and energy consumption.

Because electronics cabinets house equipment that generates heat during operation, cabinets often include cooling systems to prevent the equipment from overheating. In addition to cooling the equipment, the enclosure also should protect against the ingress of moisture, corrosive agents, dust, insects, and other contaminants. As such, in many instances a closed loop system (i.e., one that has no exchange with external ambient air) is desirable. Often cooling systems employ heat exchangers that are mounted on the inside of the door of the cabinet. In particular, finned heat exchangers are popular for use in cabinet doors.

Modern equipment tends to generate more heat than prior devices. For example, typical wireless equipment has increased in thermal density over 100 percent in the last five years. Thus, it may be desirable to provide a cabinet with enhanced cooling.

SUMMARY

As a first aspect, embodiments of the invention are directed to an electronics cabinet. The cabinet comprises: an enclosure having a floor, a ceiling, a rear wall, opposed side walls, and a front wall that define an interior cavity; a divider panel that divides the interior cavity into upper and lower chambers; a first cooling system mounted to the enclosure to cool the upper chamber; and a second cooling system mounted to the enclosure to cool the lower chamber.

As a second aspect, embodiments of the invention are directed to an electronics cabinet, comprising: an enclosure having a floor, a ceiling, a rear wall, opposed side walls, and a door hingedly attached to one of the side walls that define an interior cavity; a divider panel that divides the interior cavity into upper and lower chambers; a first cooling system mounted to the door to cool the upper chamber; and a second cooling system mounted to the door to cool the lower chamber.

As a third aspect, embodiments of the invention are directed to an electronics cabinet, comprising: an enclosure having a floor, a ceiling, a rear wall, opposed side walls, and a door hingedly attached to one of the side walls that define an interior cavity; a divider panel that divides the interior cavity into upper and lower chambers; a first finned heat exchanger mounted to the door to cool the upper chamber; and a second finned heat exchanger mounted to the door below the first heat exchanger to cool the lower chamber.

DETAILED DESCRIPTION

Figure 1:
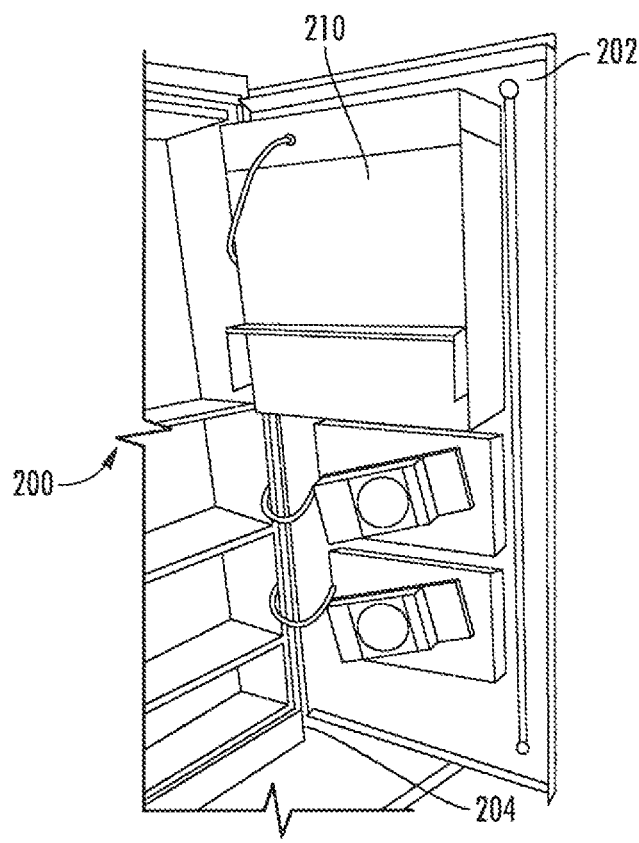
FIG. 1 is a partial perspective view of a prior electronics cabinet shown with its door open to reveal a heat exchanger mounted thereon.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
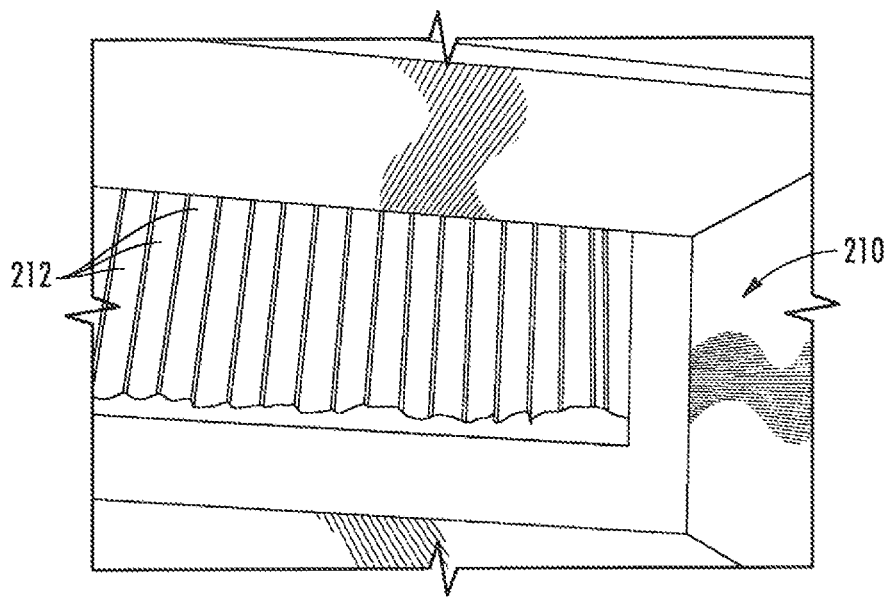
FIG. 2 is an enlarged perspective view of the fins of the heat exchanger of the cabinet of FIG. 1.

Referring now to the drawings, a prior electronics cabinet is partially illustrated in FIGS. 1 and 2 and designated at 200. The cabinet 200 is generally a rectangular box, with a door 202 hinged to one of the side walls 204. As can be seen in FIG. 1, a heat exchanger 210 is mounted to an upper portion of the inner surface of the door 202. As shown in FIG. 2, the heat exchanger 210 includes vertically disposed fins 212 that act as heat transfer surfaces. The operation of finned heat exchanger is well-understood by those of skill in this art and need not be explained in detail herein.

As noted above, cabinets are increasingly being populated with equipment that generates more heat than prior equipment. Simply employing a taller finned heat exchanger to provide greater cooling is typically unsatisfactory, as the fins 212 are less efficient at cooling at greater lengths.

Figure 3:
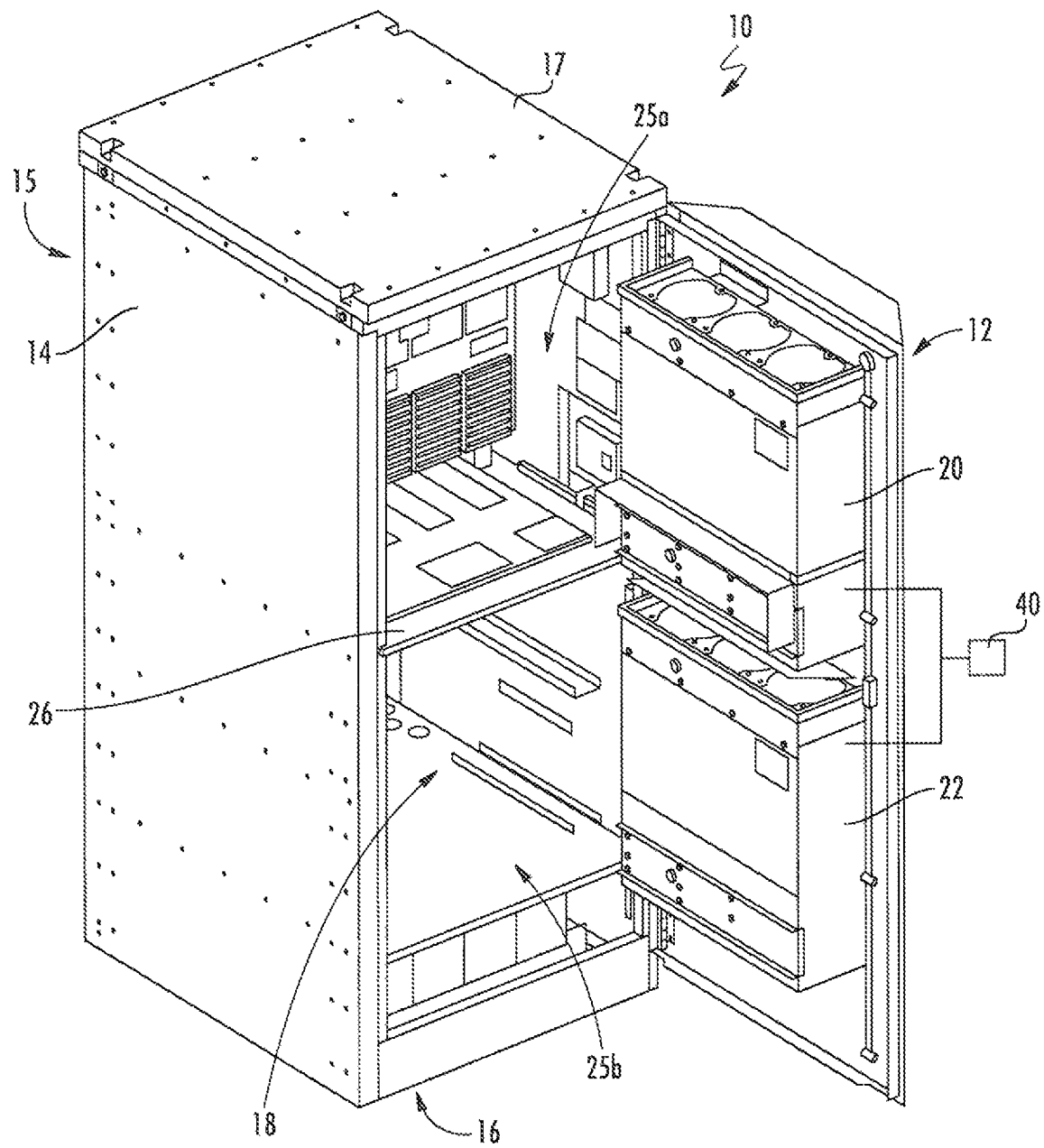
FIG. 3 is a perspective view of an electronics cabinet according to embodiments of the invention.
Figure 4:
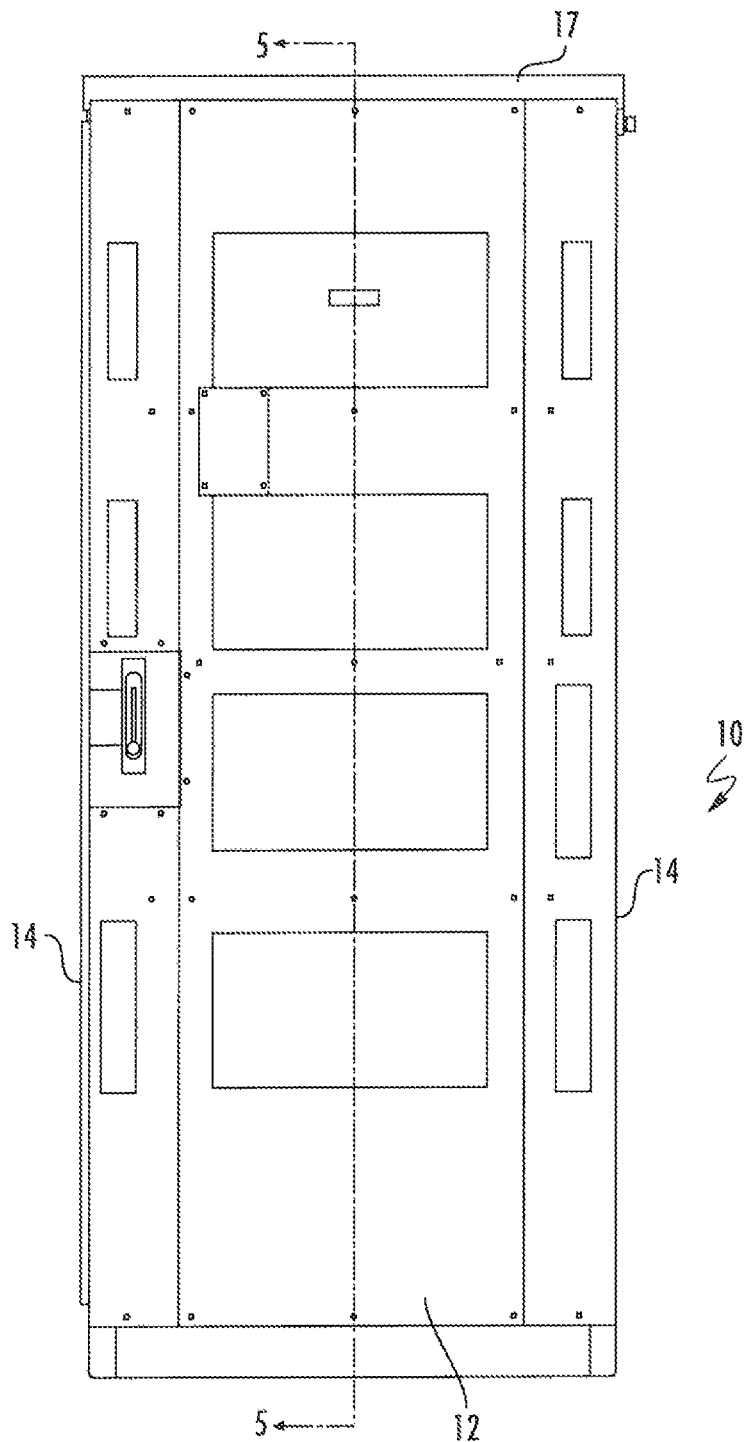
FIG. 4 is a front view of the cabinet of FIG. 3.
Figure 5:
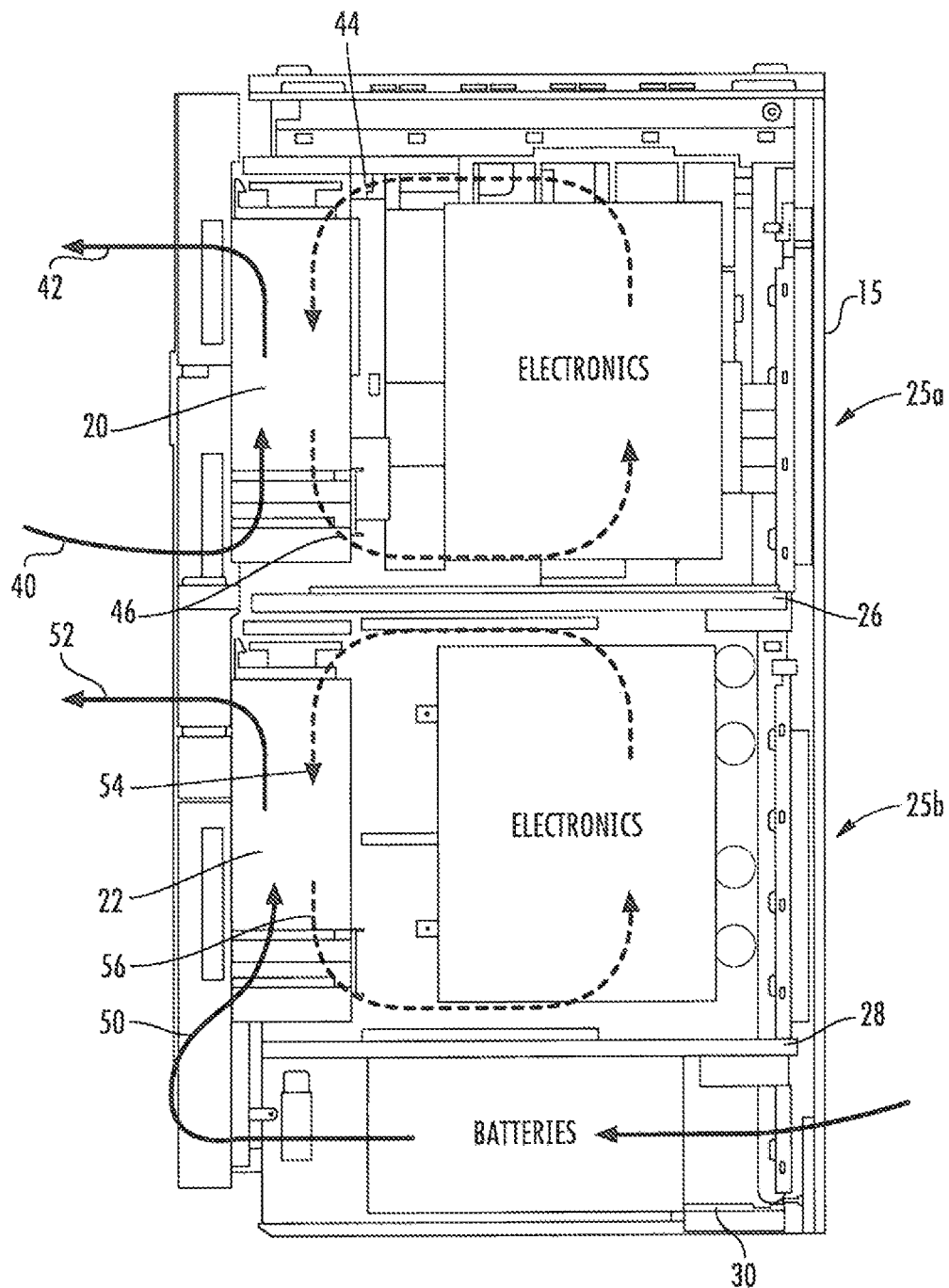
FIG. 5 is a side section view of the cabinet of FIG. 3 taken along lines 5-5 of FIG. 4 and showing air flow patterns of the upper and lower heat exchangers mounted on the door thereof.

One approach to addressing this issue is shown in FIGS. 3-5, in which a cabinet designated broadly at 10 is shown. The cabinet 10 is boxlike in the manner of the cabinet 200 above, with side walls 14, a rear wall 15, a floor 16, a ceiling 17, and a door 12 that is hinged to one of the side walls 14. These components define an overall internal cavity 18. A divider panel 26 spans the side walls 14 to divide the internal cavity 18 into separate upper and lower chambers 25a, 25b that are substantially airtight relative to each other. Typically, the cabinet 10 is between about 36 and 84 inches in height, between about 24 and 36 inches in width, and between about 18 and 36 inches in depth. Conventionally, the cabinet 10 is formed of metallic material, such as steel.

The upper and lower chambers 25a, 25b include electronics equipment mounted therein. Typical electronics equipment includes radios, multicarrier power amplifiers (MCPA), power supplies, batteries, and wireless, cell site backhaul equipment.

As can be seen in FIG. 3, the door 12 includes two heat exchangers: an upper heat exchanger 20 and a lower heat exchanger 22. These heat exchangers 20, 22, which in some embodiments may be finned heat exchangers, operate to cool, respectively, the upper and lower chambers 25a, 25b of the cabinet 10.

The inclusion of two heat exchangers 20, 22 arranged in a stacked relationship can improve cooling capability significantly. First, the cooling capacity of the cabinet 10 is approximately doubled over that of the cabinet 200. Notably, this increased capacity would not be realized if the heat exchanger 210 of the cabinet 200 were simply doubled in height, as the efficiency of finned heat exchangers diminishes with increasing length. Second, the creation of separate upper and lower chambers 25a, 25b enables these portions of the cabinet 10 to be individually cooled as needed. For example, if the upper chamber 25a includes equipment that generates considerable heat, the upper heat exchanger 20 may be operated to remove such heat while the lower heat exchanger 22 remains deactivated.

In some embodiments, sensors (not shown) may be positioned at locations within the cabinet 10 to provide feedback on thermal conditions in the cabinet 10. Such sensors, which may be thermocouples, thermistors, or other temperature-measuring devices, may be connected to a controller 40 (see FIG. 3). The controller 40 is operatively connected with the upper and lower heat exchangers 20, 22 and may be configured to activate or deactivate the heat exchangers 20, 22 based on data collected by the sensors. In some embodiments a single controller 40 may control both the upper and lower heat exchangers 20, 22; in other embodiments each heat exchanger 20, 22 may have its own controller.

Also, in some embodiments the sensors may be integrated into the heat exchangers 20, 22. In further embodiments, the controller(s) 40 may be integrated into the heat exchangers 20, 22.

It can also be seen in FIG. 5 that, in some embodiments, a second divider panel 28 serves as the floor of the lower chamber 25b and defines a battery chamber 30 just above the floor 16. The battery chamber 30 is typically separately cooled, often with an open-loop cooling system such as an air conditioner.

A typical air flow path for the cabinet 10 is shown in FIG. 5. Cool external air 40 flows upwardly through the lower end of the upper heat exchanger 20 and exits from the upper end of the upper heat exchanger 20 as heated air 42; simultaneously, heated internal air 44 in the upper chamber 25a enters the upper end of the upper heat exchanger 25a and exits the lower end as cooled air 46 by virtue of counterflowing relative to the external air 40, 42. The cooled air 46 cools the upper chamber 25a. Similarly, cooled external air 50 (which may be from the battery chamber 30 or independent of the battery chamber 30) enters the lower end of the lower heat exchanger 22 and exits the upper end as heated air 52; simultaneously, heated internal air 54 in the lower chamber 25b enters the upper end of the lower heat exchanger 22 and exits the lower end as cooled internal air 56 after counter-flowing relative to the external air 50, 52. The cooled air 56 cools the lower chamber 25b.

Those skilled in this art will appreciate that air flow into and out of the heat exchangers 20, 22 may be varied somewhat. For example, heated external air 52 exiting the lower heat exchanger 22 may be forced to exit near one side wall 14 (e.g., the left side wall 14), while the cooler external air 40 may be drawn near the other side wall 14 (e.g., the right side wall 14). This pattern may be followed to ensure that the cool external air 40 is not mixed with the heated external air 52 from the lower heat exchanger 22, which could reduce thermal efficiency. Also, the flow through the battery chamber 30 may be reversed or otherwise redirected (in some instances noise may be reduced). Other patterns may also be followed.

Those skilled in this art will appreciate that other varieties of heat exchangers, such as heat pipes and direct air cooling (DAC) in conjunction with hydrophobic air filters used to repel or prohibit water or water vapor from entering the enclosure, may be employed in place of the finned heat exchangers 20, 22 discussed herein.

Also, those skilled in this art will appreciate that the inclusion of separately cooled upper and lower chambers 25a, 25b may influence the arrangement of electronics equipment within the cabinet 10. For example, it may be desirable to mount the pieces of equipment that generate the most heat (e.g., AC to DC power rectifier units or equipment that can withstand higher operating temperatures) in one chamber (e.g., the upper chamber 25a), and the pieces of equipment that generate the least heat (e.g., radios or equipment that is limited to operate at lower temperatures) in the other chamber (e.g., the lower chamber 25b), with the result that the lower chamber 25b requires less cooling and therefore saves power. Alternatively, it may be desirable to mount the most thermally sensitive pieces of equipment in the same chamber and control that chamber more tightly. As another alternative, it may be desirable to attempt to balance or even out the thermal output of the pieces of equipment in each chamber 25a, 25b. Other arrangements may be suitable also.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. An electronics cabinet, comprising:
    an enclosure having a floor, a ceiling, a rear wall, opposed side walls, and a front wall that define an interior cavity;
    a divider panel that divides the interior cavity into upper and lower chambers;
    a first cooling system mounted to the enclosure to cool the upper chamber; and
    a second cooling system mounted to the enclosure to cool the lower chamber;
    wherein the first and second cooling systems are first and second heat exchangers.

2. The electronics cabinet defined in claim 1, wherein the front wall comprises a door hingedly attached to one of the side walls.

3. The electronics cabinet defined in claim 1, wherein the first and second heat exchangers are finned heat exchangers.

4. The electronics cabinet defined in claim 1, wherein the first heat exchanger is mounted above the second heat exchanger.

5. The electronics cabinet defined in claim 1, wherein the upper and lower chambers are relatively airtight relative to each other.

6. The electronics cabinet defined in claim 1, further comprising a battery chamber that is separated from the lower chamber by a second divider panel.

7. The electronics cabinet defined in claim 1, further comprising a controller operatively connected to the first and second cooling systems.

8. An electronics cabinet, comprising:
    an enclosure having a floor, a ceiling, a rear wall, opposed side walls, and a door hingedly attached to one of the side walls that define an interior cavity;
    a divider panel that divides the interior cavity into upper and lower chambers;
    a first cooling system mounted to the door to cool the upper chamber; and
    a second cooling system mounted to the door to cool the lower chamber;
    wherein the first and second cooling systems are first and second finned heat exchangers.

9. The electronics cabinet defined in claim 8, wherein the first heat exchanger is mounted above the second heat exchanger.

10. The electronics cabinet defined in claim 8, wherein the upper and lower chambers are relatively airtight relative to each other.

11. The electronics cabinet defined in claim 8, further comprising a battery chamber that is separated from the lower chamber by a second divider panel.

12. An electronics cabinet, comprising:
    an enclosure having a floor, a ceiling, a rear wall, opposed side walls, and a door hingedly attached to one of the side walls that define an interior cavity;
    a divider panel that divides the interior cavity into upper and lower chambers;
    a first finned heat exchanger mounted to the door to cool the upper chamber;
    a second finned heat exchanger mounted to the door below the first heat exchanger to cool the lower chamber; and
    a battery chamber that is separated from the lower chamber by a second divider panel, wherein the battery chamber comprises an open-loop cooling system;
    wherein the first and second heat exchangers are configured such that heated external air exits one of the first and second heat exchangers near one of the side walls and cooler external air is drawn into the other one of the first and second heat exchangers near the other one of the side walls.

13. The electronics cabinet defined in claim 12, wherein the upper and lower chambers are relatively airtight relative to each other.

* * * * *